United States Patent
Liu et al.

(10) Patent No.: US 10,025,047 B1
(45) Date of Patent: Jul. 17, 2018

(54) INTEGRATION OF SILICON PHOTONICS IC FOR HIGH DATA RATE

(71) Applicant: Google Inc., Mountain View, CA (US)

(72) Inventors: Hong Liu, Palo Alto, CA (US); Ryohei Urata, San Carlos, CA (US); Woon Seong Kwon, Cupertino, CA (US); Teckgyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/488,237

(22) Filed: Apr. 14, 2017

(51) Int. Cl.
| | |
|---|---|
| *G02B 6/42* | (2006.01) |
| *H05K 3/30* | (2006.01) |
| *H01L 23/00* | (2006.01) |
| *H01L 25/16* | (2006.01) |
| *H05K 1/11* | (2006.01) |
| *H05K 1/18* | (2006.01) |
| *H05K 3/32* | (2006.01) |

(52) U.S. Cl.
CPC ........... *G02B 6/428* (2013.01); *G02B 6/4243* (2013.01); *H01L 24/17* (2013.01); *H01L 24/81* (2013.01); *H01L 25/167* (2013.01); *H05K 1/11* (2013.01); *H05K 1/18* (2013.01); *H05K 3/301* (2013.01); *H05K 3/32* (2013.01); *H01L 2224/16145* (2013.01); *H01L 2224/16225* (2013.01); *H01L 2924/1426* (2013.01); *H05K 2201/10121* (2013.01); *H05K 2201/10378* (2013.01)

(58) Field of Classification Search
CPC ...... G02B 6/428; G02B 6/4243; H05K 3/301; H05K 3/32; H05K 1/11; H05K 1/18; H05K 2201/10121; H05K 2201/10378; H01L 24/81; H01L 25/167; H01L 24/17; H01L 2224/16145; H01L 2924/1426; H01L 2224/16225
See application file for complete search history.

(56) References Cited

U.S. PATENT DOCUMENTS

| | | | |
|---|---|---|---|
| 6,563,210 B2 | 5/2003 | Sankman | |
| 6,768,190 B2 | 7/2004 | Yang et al. | |
| 7,561,762 B2 * | 7/2009 | Miyoshi | G02B 6/42 |
| | | | 385/14 |
| 8,971,676 B1 | 3/2015 | Thacker et al. | |

(Continued)

OTHER PUBLICATIONS

3DIC.org "Fan-Out Wafer-Level Packaging (FOWLP)" Retrieved from URL: http://www.3dic.org/FOWLP on Apr. 14, 2017 (7 pages).

(Continued)

*Primary Examiner* — Ryan Lepisto
(74) *Attorney, Agent, or Firm* — McDermott Will & Emery LLP

(57) ABSTRACT

Signal integrity in high-speed applications is dependent on both the underlying device performance and electronic packaging methods. The maturity of chip-on-board (COB) packaging technology using wire bonding makes it a cost beneficial option for the mass production of high-speed optical transceivers. However, wire bonding introduces parasitic inductance associated with the length of the bond wires that limits the scalability of the system for higher data throughput. A high-speed optical transceiver package according to a first proposed configuration minimizes packaging related parasitic inductance by vertically integrating components using flip-chip bonding. A high-speed optical transceiver package according to a second proposed configuration minimizes packaging related parasitic inductance with horizontal tiling of components using a chip carrier and flip-chip bonding.

14 Claims, 6 Drawing Sheets

(56) References Cited

U.S. PATENT DOCUMENTS

| | | | |
|---|---|---|---|
| 9,500,821 B2* | 11/2016 | Hochberg | G02B 6/423 |
| 9,570,883 B2* | 2/2017 | Zarbock | H01L 25/167 |
| 9,651,751 B1 | 5/2017 | Ding et al. | |
| 2002/0196997 A1 | 12/2002 | Chakravorty et al. | |
| 2003/0002770 A1 | 1/2003 | Chakravorty et al. | |
| 2005/0058408 A1 | 3/2005 | Colgan et al. | |
| 2005/0135732 A1 | 6/2005 | Crow et al. | |
| 2009/0310921 A1 | 12/2009 | Kurita | |
| 2011/0044369 A1 | 2/2011 | Andry et al. | |
| 2011/0206379 A1* | 8/2011 | Budd | H04B 10/801 |
| | | | 398/116 |
| 2015/0153524 A1 | 6/2015 | Chen | |
| 2015/0279828 A1 | 10/2015 | Koopmans et al. | |
| 2016/0124164 A1 | 5/2016 | Doerr | |
| 2016/0216445 A1 | 7/2016 | Thacker et al. | |
| 2016/0377823 A1* | 12/2016 | Garland | G02B 6/4272 |
| | | | 385/14 |

OTHER PUBLICATIONS

Carroll, Lee et al. "Photonic Packaging: Transforming Silicon Photonic Integrated Circuits into Photonic Devices" Applied Sciences, vol. 6, No. 426, 2016 (21 pages).

Dillinger, Tom. "The Package Assembly Design Kit (PADK) . . . the start of something big" published Aug. 19, 2016 on SemiWiki.com, Retrieved from URL: http://www.semiwiki.com/forum/content/6104-package-assembly-design-kit-padk-start-something-big.html (4 pages).

Amkor Technology, "Package on Package (PoP | PSfvBGA | PSfcCSP | TMV(R) PoP)" Retrieved from URL: https://www.amkor.com/go/Package-on-Package on Apr. 14, 2017 (5 pages).

AD-STAG. "Interposer Benefit", Industrial Technology Research Institute, Retrieved from URL: http://1.1bp.blogspot.com/_Bq3z0Dk2y8M/TUw-o_nMgLI/AAAAAAAAAUQ/DVIrwFSoYJU/s1600/36-12+ITRI+interposer.jpg on Apr. 14, 2017 (1 page).

Al-Sarawi, Said F. "Solder Bump Bonding" Centre for High Performance Integrated Technologies and Systems (CHIPTEC) Mar. 1997. Retrieved from URL: http://www.eleceng.adelaide.edu.au/Personal/alsarawi/node9.html on Apr. 14, 2017 (1 page).

Office Action dated Jan. 3, 2018 in U.S. Appl. No. 15/488,235.

International Search Report and Written Opinion dated Apr. 25, 2018 in International (PCT) Application No. PCT/US2018/019203.

International Search Report and Written Opinion dated May 18, 2018 in International (PCT) Application No. PCT/US2018/018822.

* cited by examiner

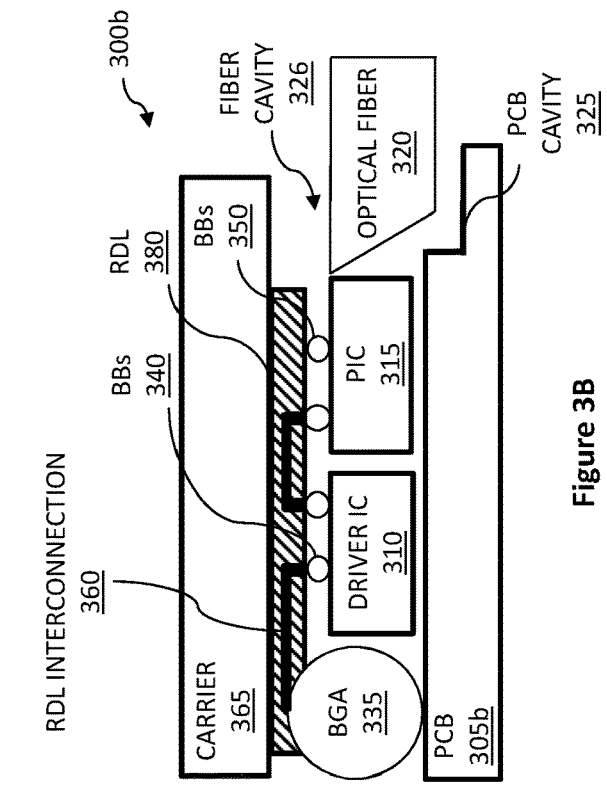
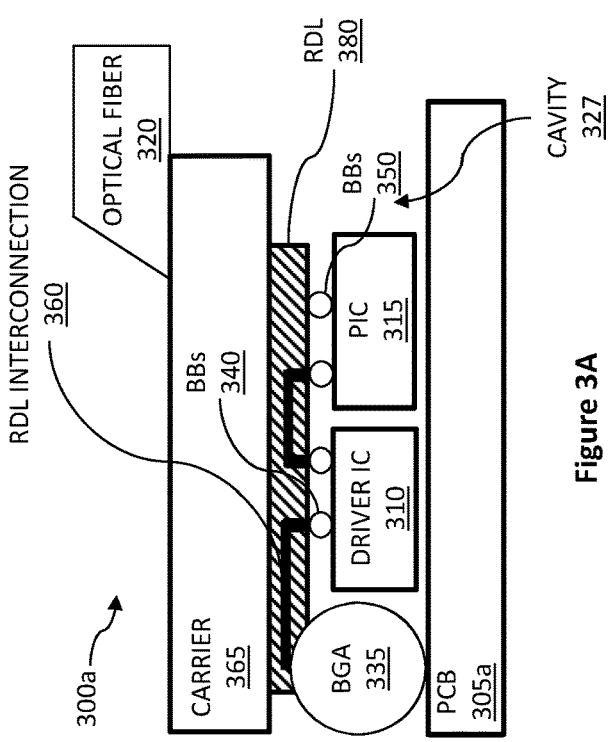

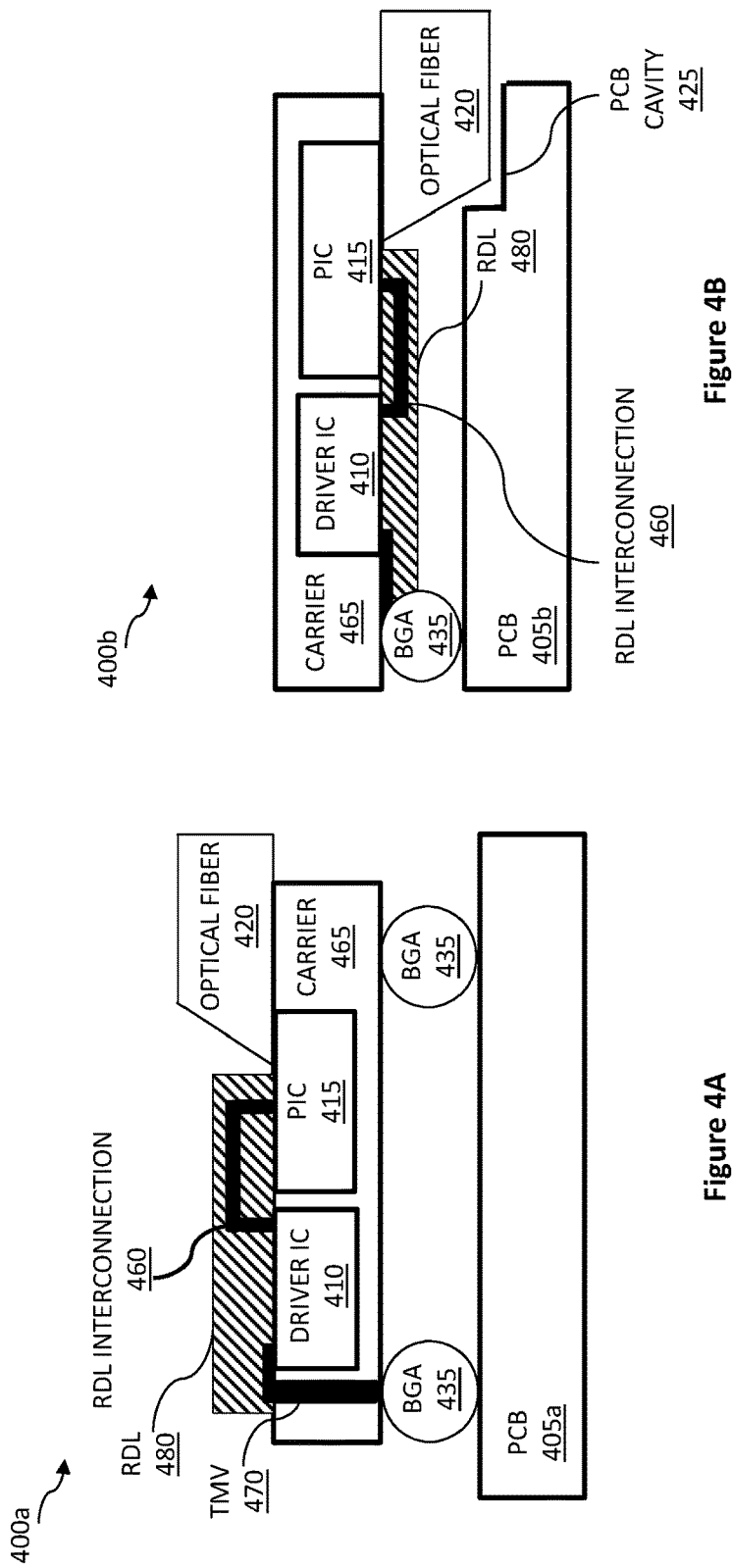

US 10,025,047 B1

INTEGRATION OF SILICON PHOTONICS IC FOR HIGH DATA RATE

BACKGROUND

Signal integrity in high-speed applications is dependent on both the underlying device performance and electronic packaging methods. For high-speed optical transceivers, it is valuable to minimize the radio frequency (RF) loss due to packaging. The maturity of chip-on-board (COB) packaging technology using wire bonding makes it a cost beneficial option for the mass production of high-speed optical transceivers. However, wire bonding introduces parasitic inductance associated with the length of the bond wires that limits the scalability of the system for higher data throughput.

SUMMARY

According to one aspect, the subject matter described in this disclosure relates to an integrated component package that includes a printed circuit board (PCB), a photonics integrated circuit (PIC) that is mechanically coupled to the PCB on a first side of the PIC and a driver integrated circuit (driver IC) having a first side. The first side of the driver IC is directly mechanically and electrically coupled to a second side of the PIC via a first set of bump bond connections. The first side of the driver IC is also electrically coupled to the PCB via a second set of bump bond connections.

According to another aspect, the subject matter described in this disclosure relates to an integrated component package includes a printed circuit board (PCB) having a PCB cavity in a first side of the PCB sized to accept an optical fiber, a plurality of BGA connections mechanically and electrically coupled to the PCB on the first side of the PCB and a carrier directly mechanically coupled to the PCB on a first side of the carrier via at least one of the BGA connections. The carrier includes a redistribution layer (RDL) disposed on the first side of the carrier and includes a plurality of RDL interconnections. The integrated component package further includes a photonics integrated circuit (PIC) mechanically coupled to the carrier and a driver IC mechanically coupled to the carrier. A first side of the driver IC is electrically coupled to a first side of the PCB via at least one of the RDL connections and at least one of the BGA connections. The first side of the driver IC is also electrically coupled to a first side of the PIC via at least one of the RDL interconnections.

According to another aspect, the subject matter described in this disclosure relates to a method of assembling an integrated component package that includes mechanically coupling a photonics integrated circuit (PIC) to a printed circuit board (PCB) on a first side of the PIC, directly mechanically and electrically coupling a first side of a driver IC to a second side of the PIC via a first set of bump bond connections and electrically coupling the first side of a driver IC to the PCB via a second set of bump bond connections.

According to another aspect, the subject matter described in this disclosure relates to a method of assembling an integrated component package that includes mechanically and electrically coupling a plurality of BGA connections to a printed circuit board (PCB) on the first side of the PCB. The PCB has a PCB cavity sized to accept an optical fiber. The method includes mechanically coupling a carrier to the PCB on a first side of the carrier via at least one of the BGA connections. The carrier includes a redistribution layer (RDL) disposed on the first side of the carrier and including a plurality of RDL interconnections. The method also includes mechanically coupling a photonics integrated circuit (PIC) to the carrier and mechanically coupling a driver IC to the carrier. The method further includes electrically coupling a first side of the driver IC to a first side of the PCB via at least one of the RDL connections and at least one of the BGA connections and electrically coupling the first side of the driver IC to the first side of the PIC via at least one of the RDL interconnections.

BRIEF DESCRIPTION OF THE DRAWINGS

The foregoing will be apparent from the following more particular description of example implementations of the invention, as illustrated in the accompanying drawings. The drawings are not necessarily to scale, emphasis instead being placed upon illustrating implementations of the present invention.

FIG. 3A is a diagram of a side view of a third integrated package configuration according to an example implementation.

FIG. 3B is a diagram of a side view of a fourth integrated component package according to an example implementation.

FIG. 4A is a diagram of a side view of a fifth integrated component package configuration according to an example implementation.

FIG. 4B is a diagram of a side view of a sixth integrated component package configuration according to an example implementation.

For purposes of clarity, not every component may be labeled in every figure. The drawings are not intended to be drawn to scale. Like reference numbers and designations in the various figures indicate like elements.

DETAILED DESCRIPTION

Signal integrity in high-speed applications is dependent on both the underlying device performance and electronic packaging methods. For high-speed optical transceivers, it is valuable to minimize the radio frequency (RF) loss due to packaging. The maturity of chip-on-board (COB) packaging technology using wire bonding makes it a cost beneficial option for the mass production of high-speed optical transceivers. However, wire bonding introduces parasitic inductance associated with the length of the bond wires that limits the scalability of the system for higher data throughput. The electrical issues due to wire bonding become a bottleneck as the on-board data rate of high-speed optical transceivers increases beyond 25 Gbps/channel.

Integrated component packages according to the present disclosure can be used for the optoelectronic package integration of high-speed optical transceivers. Typically, an integrated component package of a high-speed optical transceiver includes a driver integrated circuit (driver IC) electrically coupled to both a photonics integrated circuit (PIC) and a printed circuit board (PCB). In some conventional package configurations, the driver IC is interconnected to the PIC and the PCB via wire bonding. In other conventional package configurations, the driver IC may be interconnected to the PIC via bump bonding and to the PCB through the PIC via wire bonding. However, both of these configurations are electrically limited by the parasitic inductance associated with the length of the bond wires. Alternatively, the driver IC may be interconnected to the PIC via bump bonding and interconnected to the PCB through the PIC. The interconnection of the driver IC to the PCB through the PIC may use through-silicon vias (TSVs) integrated into the PIC. However, limitations of this configuration include the complexity of integrating TSVs through the PIC along with the parasitic inductance introduced by the TSV die stacking.

Certain high-speed optical transceiver packages and package assembly methods of the present disclosure reduce package related parasitic inductance with vertically stacked components and flip-chip bonding. Other high-speed optical transceiver packages and package assembly methods of the present disclosure reduce package related parasitic inductance with a combination of vertically stacked and horizontally tiled components. The integrated component packages disclosed herein include at least an electronic integrated circuit (EIC) such as a driver-chip or driver IC integrated with a photonic integrated circuit (PIC) on a printed circuit board (PCB). The integrated packages also include electrical and physical connections between the various components. The driver IC is electrically connected to both the PIC and the PCB. In some implementations, the PIC may be physically connected to the PCB.

Figure 1B:
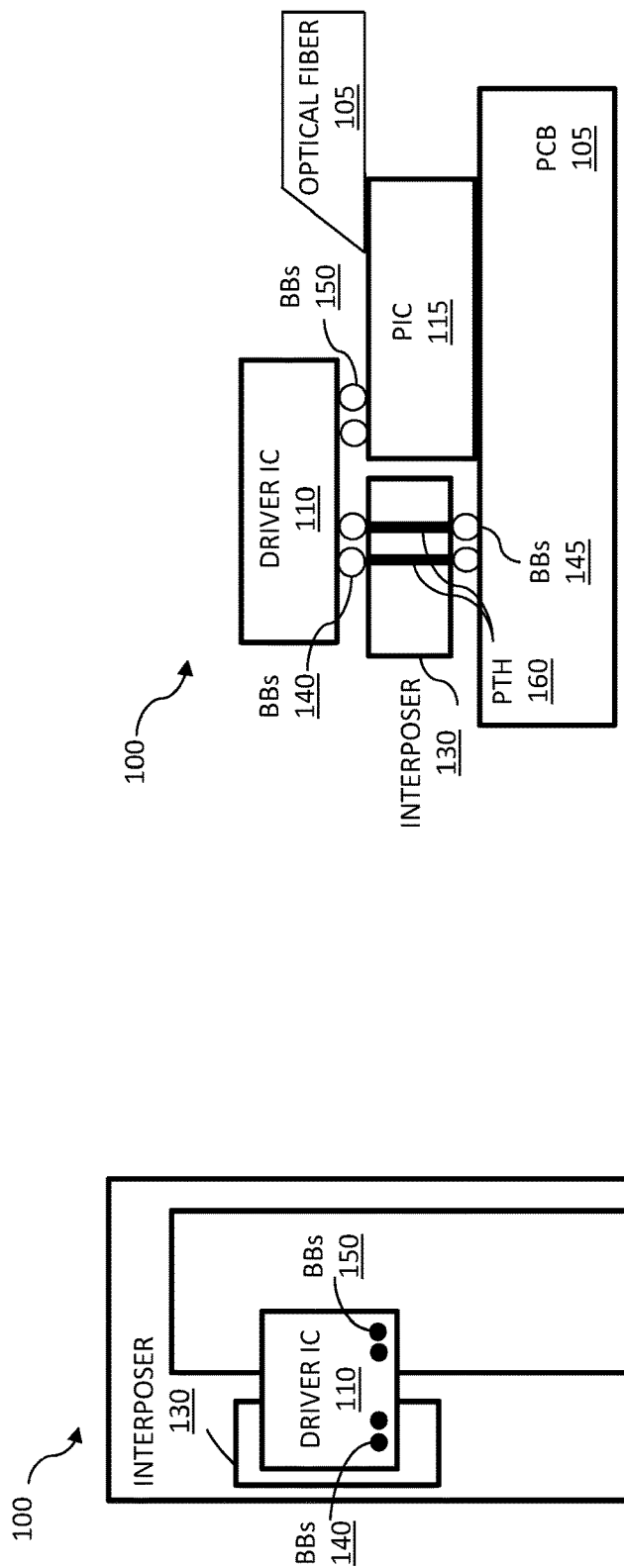
FIG. 1B is a diagram of a side view of the first integrated component package configuration shown in FIG. 1A.
Figure 1A:
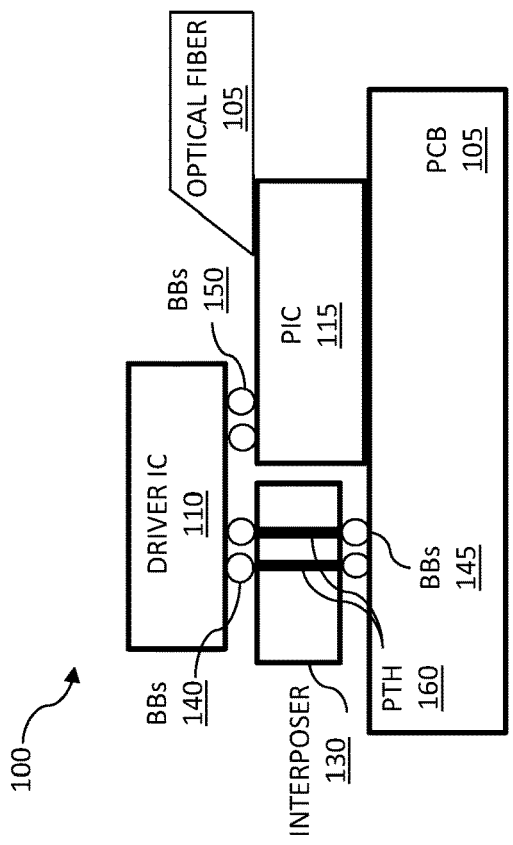
FIG. 1A is a diagram of a top down view of a first integrated component package configuration according to an example implementation.

FIG. 1A is a diagram of a top down view of a first integrated component package configuration 100 according to an example implementation. FIG. 1B is a diagram of a side view of the first integrated component package configuration 100 shown in FIG. 1A. The first integrated component package configuration 100 includes a printed circuit board (PCB) 105, a photonics IC (PIC) 115, an electronic IC (EIC) such as a driver IC 110, and an interposer 130. The PCB 105 has a top side on which the components are located (also referred to as a first side or a component side of the PCB 105). The PCB 105 also has a bottom side or a second side. The PIC 115, driver IC 110, and interposer 130 each also have a first side and a second side. The driver IC 110 is directly electrically connected to both the PIC 115 and indirectly electrically connected to the PCB 105 via the interposer 130.

The PIC 115 is located on a top side or component side of the PCB 105. The first side of the PIC 115 is physically connected to the surface of the top side of the PCB 105. In some implementations, the first side of the PIC 115 is surface mounted onto the top side of the PCB 105. In some implementations, the PIC 115 may be an externally modulated laser (EML), a monolithic tunable laser, a widely tunable laser or other optical transmitter incorporating multiple photonic functions into a single device.

The driver IC 110 is vertically stacked on the second side of the PIC 115 such that a portion of the driver IC 110 overlaps the second side of the PIC 115 while a portion of the driver IC 110 overlaps the interposer 130.

As mentioned above, the driver IC 110 is electrically connected to both the PIC 115 and the PCB 105. The portion of the driver IC 110 that overlaps the second side of the PIC 115 is directly flip-chip connected to the second side of the PIC 115 with one or more bump bonds (BBs) 150. The BBs 150 provide an electrical interface between the driver IC 110 and the PIC 115. The BBs 150 also provide a physical or mechanical interface between the driver IC 110 and the second side of the PIC 115. In addition to being electrically connected to the PIC 115, the driver IC 110 is also electrically connected to the PCB 105. The driver IC 110 is physically connected to the PCB 105 via the interposer 130. The portion of the driver IC 110 overlaps the interposer 130 is directly flip-chip connected to a first side of the interposer 130 with one or more bump bonds (BBs) 140. The second side of the interposer 130 is physically and electrically connected to the surface of the topside of the PCB 105 via one or more other bump bonds (BBs) 145. The interposer 130 along with the BBs 140 and BBs 145 provides an electrical and mechanical interface between the driver IC 110 and the PCB 105.

In some implementations, the interposer 130 may include a multi-layer substrate that further includes alternating layers of conductors and dielectrics. In some implementations, the interposer 130 may include glass. In some implementations, the interposer 130 may further include one or more plated thru-holes (PTHs) 160 and an electrical connection between the driver IC 110 and the PCB 105 via the interposer 130 may include the one or more of the PTHs 160. In some implementations, the interposer 130 may include silicon and the one or more PTHs 160 may be through-silicon vias (TSVs). The flip-chip vertical integration of the driver IC 110 with the PIC 115 and PCB 105, as shown in FIGS. 1A and 1B, reduces the length of the interconnections between the components and thereby reduces the packaging related parasitic inductance.

Figure 2B:
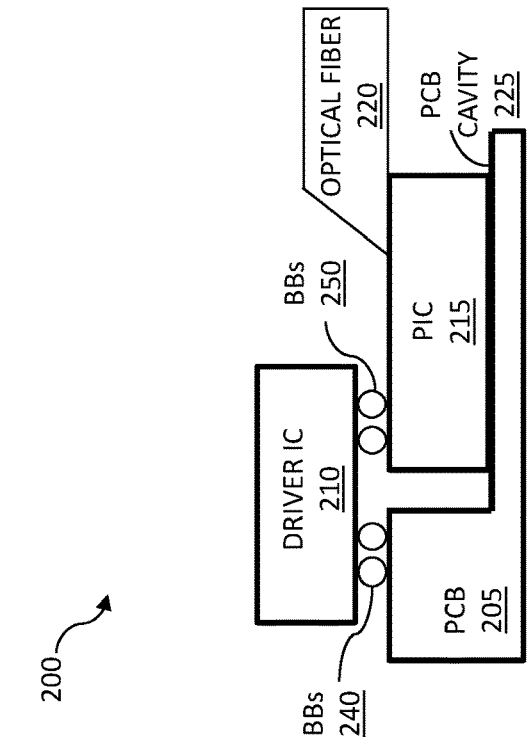
FIG. 2B is a diagram of a side view of the second integrated component package configuration shown in FIG. 2A.
Figure 2A:
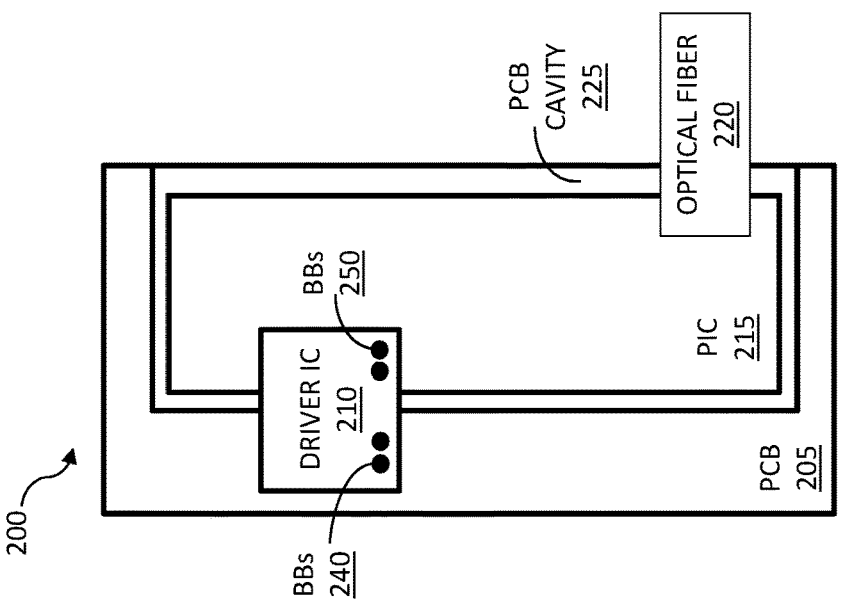
FIG. 2A is a diagram of a top down view of a second integrated component package configuration according to an example implementation.

FIG. 2A is a diagram of a top down view of a second integrated component package configuration 200 according to an example implementation. FIG. 2B is a diagram of a side view of the second integrated component package configuration 200 shown in FIG. 2A. The second integrated component package configuration 200 includes a printed circuit board (PCB) 205, a photonics IC (PIC) 215 and an electronic IC (EIC) such as a driver IC 210. The PCB 105 has a top side on which the components are located (also referred to as a first side or a component side of the PCB 205). The PCB 205 also has a bottom side or a second side. The PIC 215 has a first side and a second side. The driver IC 210 also has a first side and a second side. The driver IC 210 is electrically connected to both the PIC 215 and the PCB 205.

The top side of the PCB 205 includes a recess or cavity such as the cavity 125. The PIC 215 is located within the cavity 225. The first side of the PIC 215 is physically connected to the PCB 205 within the cavity 225. In some implementations, the first side of the PIC 215 may be surface mounted onto the floor of the cavity 225. As shown in FIG. 2B, when the PIC 215 is located within the cavity 225 and the first side of the PIC 255 is physically connected to the floor of the cavity 225, the second side of the PIC 215 is aligned with the top side of the PCB 205. The alignment is achieved either by varying the depth of the cavity or the height of the underfill used in surface mounting the PIC 215 to the floor of the cavity 225. As in FIGS. 1A and 1B, in some implementations, the PIC 215 may be an externally modulated laser (EML), a monolithic tunable laser, a widely tunable laser or other optical transmitter incorporating multiple photonic functions into a single device.

The driver IC 210 is vertically stacked on a second side of the PIC 215 such that a portion of the driver IC 210 overlaps the second side of the PIC 215 while a portion of the driver IC 210 overlaps the top side of the PCB 205.

As mentioned above, the driver IC 210 is electrically connected to both the PIC 215 and the PCB 205. The portion of the driver IC 210 that overlaps the second side of the PIC 215 is directly flip-chip connected to the second side of the PIC 215 with one or more bump bonds (BBs) 250. The BBs 250 provides an electrical interface between the driver IC 210 and the PIC 215. The BB 250 also provides a physical or mechanical interface between the driver IC 210 and the second side of the PIC 215.

As mentioned above, in addition to being electrically connected to the PIC 215, the driver IC 210 is also electrically connected to the PCB 205. The portion of the driver IC 210 that overlaps the PCB 205 is directly flip-chip connected to the surface of the component side of the PCB 105 with one or more bump bonds (BBs) 240. The BBs 240 provide an electrical interface between the driver IC 210 and the PCB 205. The BBs 240 also provide a physical or mechanical interface between the driver IC 210 and the component side of the PCB 205.

By directly flip-chip connecting the driver IC 210 to both the PCB 205 and the PIC 215, i.e., without using an interposer between the Driver IC 210 and the PCB 205, the second integrated component package 200 shown in FIGS. 2A and 2B may further reduce the packaging related parasitic inductance.

FIG. 3A is a diagram of a side view of a third integrated component package configuration 300a according to an example implementation. The integrated component package configuration 300a includes a PCB 305a, an electronic IC (EIC) such as a driver IC 310, a photonic IC (PIC) 315 and a chip carrier such as the carrier 365. The PCB 305a has a top side on which the components are located (also referred to as a first side or a component side of the PCB 305). The PCB 305a also has a bottom side or a second side. The PIC 315 has a first side and a second side. The driver IC 310 also has a first side and a second side. The driver IC 310 is electrically connected to both the PIC 315 and the PCB 305a. The package configuration 300 also includes a plurality of ball grid array (BGA) connections such as the BGA connection 335. The BGA connection 335 is physically connected to the top side of the PCB 305a. The carrier 365 has a first side and a second side. The carrier 365 includes a redistribution layer (RDL) 380 disposed on a portion of the first side of the carrier 365.

As shown in FIG. 3A, the package configuration 300a includes a combination of vertically stacked and horizontally tiled components. The carrier 365 is connected to the PCB 305a such that the first side of the carrier 365 is opposite the top side of the PCB 305a. The carrier 365 is physically and electrically connected to the PCB 305a via one or more of the BGA connections 335.

The driver IC 310 and the PIC 315 are horizontally tiled with respect to each other and physically connected to the first side of the carrier 365. Therefore, the driver IC 310 and the PIC 315 are located between the first side of the carrier 365 and the top side of the PCB 305a. The driver 310 and the PIC 315 are physically connected adjacent to one another on different portions of the first side of the carrier 365. In some implementations, the driver IC 310 and the PIC 315 are horizontally spaced on the carrier 365 according to the die spacing requirements of the driver IC 310 and PIC 315. A first side of the driver IC 310 is physically connected to a portion of the carrier 365 that includes the RDL 380. The first side of the driver IC 110 is directly flip-chip connected to the RDL 380 with one or more bump bonds (BBs) 340.

The BBs 340 provide a mechanical interface between the driver IC 310 and the carrier 365. The first side of the PIC 315 is also directly flip-chip connected to the RDL 380 with one or more bump bonds (BBs) 350. The BBs 150 provide a mechanical interface between the first side of the PIC 315 and the first side of the carrier 365.

The driver IC 310 is electrically connected to both the PIC 315 and the PCB 305a. The driver IC 310 is electrically connected to the PIC 315 via the BBs 340, one or more RDL interconnections 360 and the BBs 350. The driver IC 310 is electrically connected to the PCB 305 via one or more RDL interconnections 360 and one or more of the BGA connections 335.

As shown in FIG. 3A, a space 327 located adjacent to the PIC 315 and defined by the first side of the carrier 365 and the top side of the PCB 305a may not be sized to accept the optical fiber 320 thus preventing a direct optical coupling between the optical fiber 320 and the PIC 315 within the space 327. Accordingly, in FIG. 3A, the optical fiber 320 is located above the second side of the carrier 365 and optically couples with the PIC 315 through the carrier 365. In some implementations, the carrier 365 may be comprised of a transparent material, such as glass, thereby enabling an optical coupling between the optical fiber 320 and the PIC 315 via the carrier 365.

FIG. 3B is a diagram of a side view of a fourth integrated component package configuration 300b according to an example implementation. The fourth integrated package configuration 300b is similar to the third integrated component package configuration 300a. The integrated component package configuration 300b includes a PCB 305b, an electronic IC (EIC) such as a driver IC 310, a photonic IC (PIC) 315 and a chip carrier such as the carrier 365. The PCB 305b has a top side on which the components are located (also referred to as a first side or a component side of the PCB 305). The PCB 305b also has a bottom side or a second side. The PIC 315 has a first side and a second side. The driver IC 310 also has a first side and a second side. The driver IC 310 is electrically connected to both the PIC 315 and the PCB 305b. The package configuration 300 also includes a plurality of ball grid array (BGA) connections such as the BGA connection 335. The BGA connection 335 is physically connected to the top side of the PCB 305a. The carrier 365 has a first side and a second side. The carrier 365 includes a redistribution layer (RDL) 380 disposed on a portion of the first side of the carrier 365.

As shown in FIG. 3B, the package configuration 300b includes a combination of vertically stacked and horizontally tiled components. The carrier 365 is connected to the PCB 305b such that the first side of the carrier 365 is opposite the top side of the PCB 305b. The carrier 365 is physically and electrically connected to the PCB 305b via one or more of the BGA connections 335.

The driver IC 310 and the PIC 315 are horizontally tiled with respect to each other and physically connected to the first side of the carrier 365. Therefore, the driver IC 310 and the PIC 315 are located between the first side of the carrier 365 and the top side of the PCB 305b. The driver 310 and the PIC 315 are physically connected adjacent to one another on different portions of the first side of the carrier 365. In some implementations, the driver IC 310 and the PIC 315 are horizontally spaced on the carrier 365 according to the die spacing requirements of the driver IC 310 and PIC 315. A first side of the driver IC 310 is physically connected to a portion of the carrier 365 that includes the RDL 380. The first side of the driver IC 110 is directly flip-chip connected to the RDL 380 with one or more bump bonds (BBs) 340.

The BBs 340 provide a mechanical interface between the driver IC 310 and the carrier 365. The first side of the PIC 315 is also directly flip-chip connected to the RDL 380 with one or more bump bonds (BBs) 350. The BBs 150 provide a mechanical interface between the first side of the PIC 315 and the first side of the carrier 365.

The driver IC 310 is electrically connected to both the PIC 315 and the PCB 305a. The driver IC 310 is electrically connected to the PIC 315 via the BBs 340, one or more RDL interconnections 360 and the BBs 350. The driver IC 310 is electrically connected to the PCB 305 via one or more RDL interconnections 360 and one or more of the BGA connections 335.

In some implementations, an optical fiber 320 is directly optically coupled with the PIC 315. In some implementations, the top side of the PCB 305a may further include a PCB cavity 325 located adjacent to the PIC 315 and opposite the first side of the carrier 365. In some implementations, the PCB cavity 325 may define a fiber cavity 326 adjacent to the PIC 315 between the first side of the carrier 365 and the PCB cavity 325. In some implementations, the fiber cavity 326 is sized to accept the optical fiber 320. The fiber cavity enables a direct optical coupling between the optical fiber 320 and the PIC 315 within the fiber cavity thereby reducing the overall height or form factor of the integrated component package configuration 300b.

The integrated component package configurations 300a and 300b provide straightforward electrical connections between the PIC 315 and driver IC 310, without the need for achieving vertical alignment between the components or portions of the PCB, thereby facilitating manufacturing of the package, while still avoiding wire bonds between the components, thereby reducing the inductive load of the package relative to traditional packages.

FIG. 4A is a diagram of a side view of a fifth integrated component package configuration 400a according to an example implementation. The integrated component package configuration 400 includes a PCB 405a, an electronic IC (EIC) such as a driver IC 410, a photonic IC (PIC) 415 and a chip carrier such as the carrier 465. The PCB 405a has a top side on which the components are located (also referred to as a first side or a component side of the PCB 405). The PCB 405a also has a bottom side or a second side. The PIC 415 has a first side and a second side. The driver IC 410 also has a first side and a second side. The driver IC 410 is electrically connected to both the PIC 415 and the PCB 405. The package configuration 400 also includes a plurality of ball grid array (BGA) connections such as the BGA connection 435. The BGA connection 435 is physically and electrically connected to the top side of the PCB 405. The carrier 465 has a first side and a second side. The carrier 465 includes a redistribution layer (RDL) 480 disposed on a portion of the first side of the carrier 465. In some implementations, the carrier 465, driver IC 140 and PIC 415 may be integrated using package on package (PoP) technology and packaging formats such as fan-out wafer level packaging (FO-WLP), embedded die in laminate or modular embedded die. In some implementations, the carrier 465 can be formed from a mold compound, encasing the driver IC 410 die and the PIC 415 die.

The driver IC 410 and the PIC 415 are horizontally tiled with respect to each other and embedded within the carrier 465. A first side of the driver IC 410 is physically connected to a portion of the first side of the carrier 465 that is disposed with the RDL 480. The first side of the driver IC 410 is directly connected to the RDL 480. The first side of the PIC 415 is also directly connected to the RDL 380.

The driver IC 410 is electrically connected to the PIC 415 and the PCB 405. The driver 410 is electrically connected to the PIC 415 via one or more of the RDL interconnections 460. The driver IC 410 is electrically connected to the PCB 405 via one or more of the RDL interconnections 460, one or more through-mold vias (TMV) 470 and the BGA connection 435. The optical fiber 420 located above the second side of the carrier 465 may directly optically couple with the PIC 415.

FIG. 4B is a diagram of a sixth integrated component package configuration 400b. The sixth integrated package configuration 400b is similar to the fifth integrated component package configuration 400a. In contrast to the fifth integrated package configuration 400a, the sixth integrated package configuration 400b includes a PCB 405b that includes a PCB cavity 425. The PCB cavity 425 defines a fiber cavity 427 between the first side of the carrier 465 and PCB cavity 425. The fiber cavity 427 is sized to accept an optical fiber 420. In some implementations, when the carrier 465 is vertically stacked onto the PCB 405b, the fiber cavity 427 may be located adjacent to the PIC 415. In some implementations, a first portion of the first side of the PIC 415 may overlap the PCB cavity 425 and a second portion of the first side of the PIC 415 may overlap the top surface of the PCB 405b. In some implementations, the RDL 480 may be disposed across the second portion of the first side of the PIC 415 that overlaps the top portion of the PCB 405b. As shown in FIG. 4B, the fiber cavity 427 enables a direct optical coupling between the optical fiber 420 and the PIC 415 within the fiber cavity 427, thereby reducing the overall height and form factor of the integrated component package configuration 400b.

As mentioned above, the integrated package configurations 100, 200, 300a and 300b shown in FIGS. 1A-3B may include flip-chip connections between the components using one or more bump bonds, such as the bump bonds (BBs) 140, 145, 150, 240, 250, 340 and 350. In some implementations, the bump bonds may be formed using solder. In some implementations, the bump bonds can be formed using materials other than solder, such as, without limitation copper, tin, or gold, alloys thereof, or other conductive materials or composites known by those of ordinary skill in the art to be useful in forming bump bonds.

Figure 5:
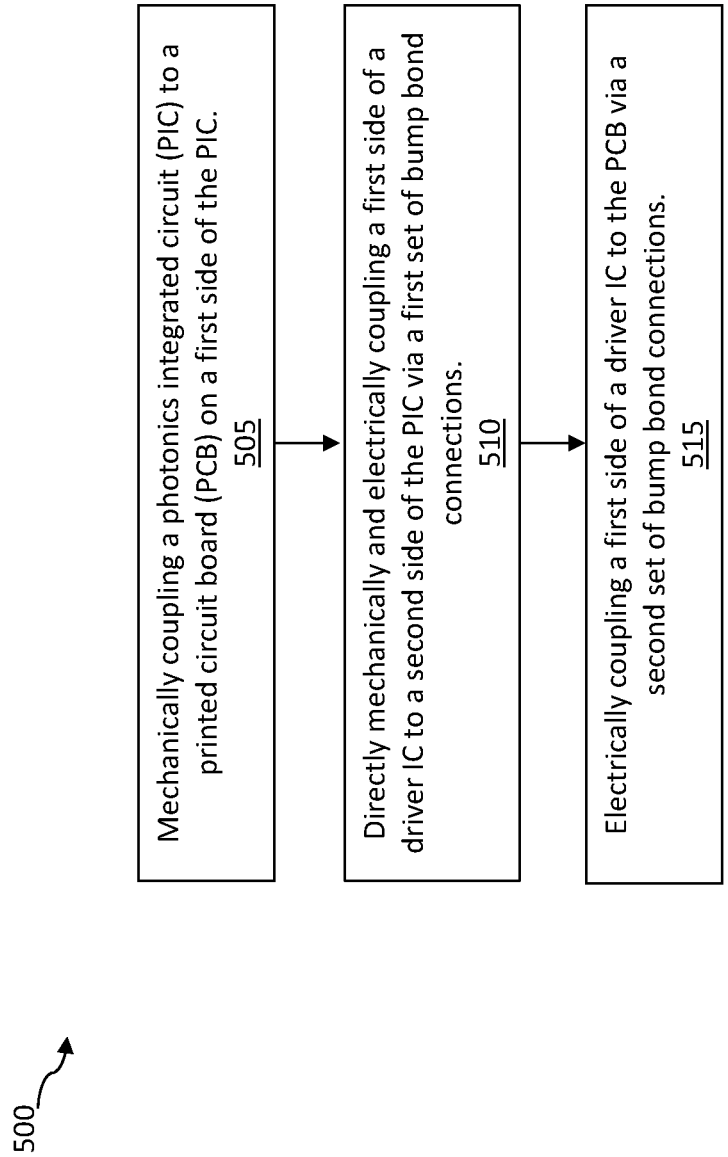
FIG. 5 is a flow diagram of a method for assembling the integrated component packages shown in FIGS. 1A-2B.

FIG. 5 is a flow diagram of a method 500 that when executed can result in the packages shown in FIGS. 1A-2B. The method 500 includes vertically integrating a PCB, a PIC and a driver IC. The method 500 includes mechanically coupling a photonics integrated circuit (PIC) to a printed circuit board (PCB) on a first side of the PIC (stage 505), directly mechanically and electrically coupling a first side of a driver IC to a second side of the PIC via a first set of bump bond connections (stage 510) and electrically coupling a first side of a driver IC to the PCB via a second set of bump bond connections (stage 515).

An example implementation of the method 500 when executed results in a package having the first package configuration 100 shown in FIGS. 1A and 1B. As mentioned above, the method 500 includes mechanically coupling a photonics integrated circuit (PIC) 115 to a printed circuit board (PCB) 105 on a first side of the PIC 115 (stage 505). The method 500 further includes directly mechanically and electrically coupling a first side of a driver IC 110 to a second side of the PIC 115 via a first set of bump bond connections such as the BBs 150 (stage 510). The method 500 further includes electrically coupling the first side of the driver IC 110 to the PCB 105 via a second set of bump bond connections such as the BBs 140 (stage 515). In some implementations, stage 515 of the method 500 may further include mechanically coupling a first side of an interposer 130 to the PCB 105 via a third set of bump bond connections such as the BBs 145. In some implementations, stage 515 of the method 500 may also include mechanically coupling a second side of the interposer 130 to the first side of the driver IC 110 via the second set of bump bond connections BBs 140. In some implementations, stage 515 of the method 500 may include electrically coupling the first side of the driver IC 110 to the PCB 105 via the second set of bump bond connections BBs 140, the interposer 130 and the third set of bump bond connections BBs 145.

An example implementation of the method 500 when executed results in a package having the second package configuration 200 shown in FIGS. 2A and 2B. The method 500 includes mechanically coupling a photonics integrated circuit (PIC) 215 to a printed circuit board (PCB) 205 on a first side of the PIC 215 (stage 505). In some implementations, stage 505 of the method 500 may include placing the PIC 215 within a PCB cavity 225 in a first side of the PCB 205 and surface bonding the PIC 215 to the floor of the PCB cavity 225 such that the first side of the PIC 215 faces a floor of the PCB cavity 225. The method 500 further includes directly mechanically and electrically coupling a first side of a driver IC 210 to a second side of the PIC 215 via a first set of bump bond connections such as the BBs 250 (stage 510). The method 500 further includes electrically coupling the first side of the driver IC 210 to the PCB 205 via a second set of bump bond connections such as the BBs 240 (stage 515). In some implementations, stage 515 of the method 500 may further include electrically coupling the first side of the driver IC 215 to the PCB 205 via the second set of bump bond connections such as the BBs 240, the interposer 230 and a third set of bump bond connections such as the BBs 245.

Figure 6:
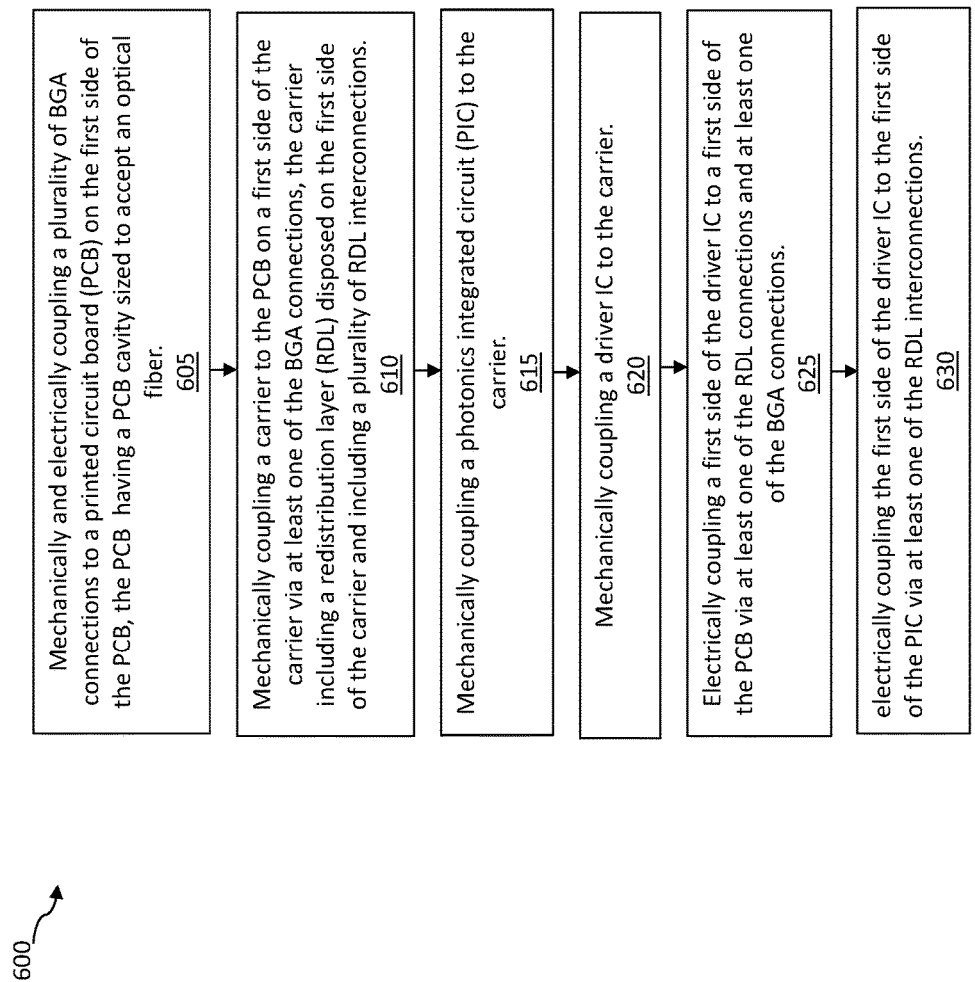
FIG. 6 is a flow diagram of a method for assembling the integrated component packages shown in FIGS. 3A-4B.

FIG. 6 is a flow diagram of a method 600 that when executed can result in the fourth and sixth package configurations 300b and 400b shown in FIGS. 3B and 4B. The method 600 includes horizontally tiling a PIC and a driver IC, relative to each other and vertically integrating the PIC and the driver IC with a PCB. The method 600 includes mechanically and electrically coupling a plurality of BGA connections to a printed circuit board (PCB) on the first side of the PCB (stage 605). The PCB has a PCB cavity sized to accept an optical fiber. The method 600 further includes mechanically coupling a carrier to the PCB on a first side of the carrier via at least one of the BGA connections, the carrier including a redistribution layer (RDL) disposed on the first side of the carrier and including a plurality of RDL interconnections (stage 610). The method 600 further includes mechanically coupling a photonics integrated circuit (PIC) to the carrier (stage 615) and mechanically coupling a driver IC to the carrier (stage 620). The method 600 further includes electrically coupling a first side of the driver IC to a first side of the PCB via at least one of the RDL connections and at least one of the BGA connections (stage 625). The method 600 includes electrically coupling the first side of the driver IC to the first side of the PIC via at least one of the RDL interconnections (stage 630).

An example implementation of the method 600 when executed results in a package having the fourth package configuration 300b shown in FIG. 3B. The method 600 includes mechanically and electrically coupling a plurality of BGA connections such as the BGA connection 335 to a printed circuit board (PCB) 305b on the first side of the PCB 305b. The PCB 305b having a PCB cavity 325 sized to accept an optical fiber 320 (stage 605). The method 600 includes mechanically coupling a carrier 365 to the PCB 305b on a first side of the carrier 365 via at least one of the BGA 335, the carrier 365 including a redistribution layer (RDL) 380 disposed on the first side of the carrier 365 and including a plurality of RDL interconnections 360 (stage 610). The method 600 further includes mechanically coupling a photonics integrated circuit (PIC) 315 to the carrier 365 (stage 615) and mechanically coupling a driver IC 310 to the carrier 365 (stage 620). In some implementations, stage 620 of the method 600 may also include locating the photonics integrated circuit (PIC) 315 between a second side of the RDL 380 and the first side of the PCB 305b and mechanically coupling a first side of the PIC 315 to the second side of the RDL 380 via at least one first bump bond connection such as the BBs 350. The method includes electrically coupling a first side of the driver IC 310 to a first side of the PCB 305b via at least one of the RDL interconnections 360 and at least one of the BGA 335 (stage 625). In some implementations, stage 625 of the method 600 may include locating the driver IC 310 between a second side of the RDL 380 and the first side of the PCB 305b. The method 600 further includes electrically coupling the first side of the driver IC 310 to the first side of the PIC 315 via at least one of the RDL interconnections 360 (stage 630). In some implementations, stage 630 of the method 600 may also include mechanically and electrically coupling the first side of the driver IC 365 to the second side of the RDL 380 via a plurality of second bump bond connections such as the BBs 340. In some implementations, stage 630 of the method 600 may include electrically coupling the first side of the driver IC 310 to the first side of the PIC 315 via at least one of the first bump bond connections such as the BBs 340, at least one of the RDL interconnections 360 and at least one of the second bump bond connections such as the BBs 350.

In some implementations, the method 600 when executed results in the package having the sixth package configuration shown in FIG. 4B. The method 600 includes mechanically and electrically coupling a plurality of BGA connections such as the BGA connection 435 to a printed circuit board (PCB) 405b on the first side of the PCB 405b, the PCB 405b having a PCB cavity 425 sized to accept an optical fiber 420 (stage 605). The method 600 includes mechanically coupling a carrier 465 to the PCB 405b on a first side of the carrier 465 via at least one BGA connection 435, the carrier 465 including a redistribution layer (RDL) 480 disposed on the first side of the carrier 465 and including a plurality of RDL interconnections 460 (stage 610). The method 600 further includes mechanically coupling a photonics integrated circuit (PIC) 415 to the carrier 465 (stage 615) and mechanically coupling a driver IC 410 to the carrier 465 (stage 620). In some implementations, stage 620 of the method 600 may further include locating the photonics integrated circuit (PIC) 415 within the carrier 465 and locating the driver IC 410 within the carrier 465. In some implementations, stage 620 of the method 600 may further include locating the PIC 415 in the PCB cavity 425 in the first side of the PCB 415 such that a first portion of the first side of the PIC 415 overlaps the PCB cavity 425 and a second portion of the first side of the PIC 415 overlaps the first side of the PCB 405b. The RDL 480 is disposed across the first side of the PIC 415 and the first side of driver IC 410. The method includes electrically coupling a first side of the driver IC 410 to a first side of the PCB 405b via at least one of the RDL interconnections 460 and at least one BGA connection 435 (stage 625). The method 600 further includes electrically coupling the first side of the driver IC 410 to the first side of the PIC 415 via at least one of the RDL interconnections 460 (stage 630). In some implementations, the RDL 480 may be disposed across the second portion of the first side of the PIC 415 that overlaps the PCB 405*b*.

As mentioned above, the methods 500 and 600 may include establishing electrical and/or mechanical connections between components by flip-chip connecting the components with one or more bump bonds. In some implementations, the bump bonds may be formed using solder. In some implementations, the bump bonds can be formed using materials other than solder, such as, without limitation copper, tin, or gold, alloys thereof, or other conductive materials or composites known by those of ordinary skill in the art to be useful in forming bump bonds.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. An integrated component package comprising:
    a printed circuit board (PCB) having a PCB cavity in a first side of the PCB sized to accept an optical fiber, wherein the PCB cavity forms a recess within the printed circuit board such that a thickness of the PCB at the PCB cavity is less than a thickness of the PCB away from the PCB cavity;
    a plurality of BGA connections mechanically and electrically coupled to the PCB on the first side of the PCB;
    a carrier directly mechanically coupled to the PCB on a first side of the carrier via at least one of the BGA connections, the carrier including a redistribution layer (RDL) disposed on the first side of the carrier and including a plurality of RDL interconnections;
    a photonics integrated circuit (PIC) mechanically coupled to the carrier; and
    a driver IC mechanically coupled to the carrier and having a first side that is
        (i) electrically coupled to a first side of the PCB via at least one of the RDL connections and at least one of the BGA connections, and
        (ii) electrically coupled to a first side of the PIC via at least one of the RDL interconnections.

2. The package of claim 1 wherein:
    the photonics integrated circuit (PIC) is located between a second side of the RDL and the first side of the PCB and a first side of the PIC is mechanically coupled to the second side of the RDL via at least one first bump bond connection;
    the driver IC is located between a second side of the RDL and the first side of the PCB and the first side of the driver IC is
        (i) mechanically and electrically coupled to the second side of the RDL via a plurality of second bump bond connections; and
        (ii) electrically coupled to the first side of the PIC via at least one of the first bump bond connections, at least one of the RDL interconnections and at least one of the second bump bond connections.

3. The package of claim 1 wherein the PCB cavity is located adjacent to the PIC.

4. The package of claim 1 wherein:
    the photonics integrated circuit (PIC) is located within the carrier;
    the driver IC is located within the carrier; and
    the RDL is further disposed across the first side of the PIC and the first side of driver IC.

5. The package of claim 4 wherein the PCB cavity is located on the first side of the PCB such that a first portion of the first side of the PIC overlaps the cavity and a second portion of the first side of the PIC overlaps the first side of the PCB.

6. The package of claim 5 wherein the RDL is disposed across the second portion of the first side of the PIC that overlaps the PCB.

7. The package of claim 1, wherein the PCB cavity is configured to facilitate a direct optical connection between an optical fiber and the PIC.

8. A method of assembling an integrated component package, the method comprising:
    mechanically and electrically coupling a plurality of BGA connections to a printed circuit board (PCB) on the first side of the PCB, the PCB having a PCB cavity sized to accept an optical fiber, wherein the PCB cavity forms a recess within the printed circuit board such that a thickness of the PCB at the PCB cavity is less than a thickness of the PCB away from the PCB cavity;
    mechanically coupling a carrier to the PCB on a first side of the carrier via at least one of the BGA connections, the carrier including a redistribution layer (RDL) disposed on the first side of the carrier and including a plurality of RDL interconnections;
    mechanically coupling a photonics integrated circuit (PIC) to the carrier;

mechanically coupling a driver IC to the carrier;
electrically coupling a first side of the driver IC to a first side of the PCB via at least one of the RDL connections and at least one of the BGA connections; and
electrically coupling the first side of the driver IC to the first side of the PIC via at least one of the RDL interconnections.

9. The method of claim 8 further comprising:
locating the photonics integrated circuit (PIC) between a second side of the RDL and the first side of the PCB and mechanically coupling a first side of the PIC to the second side of the RDL via at least one first bump bond connection;
locating the driver IC between a second side of the RDL and the first side of the PCB;
mechanically and electrically coupling the first side of the driver IC to the second side of the RDL via a plurality of second bump bond connections; and
electrically coupling the first side of the driver IC to the first side of the PIC via at least one of the first bump bond connections, at least one of the RDL interconnections and at least one of the second bump bond connections.

10. The method of claim 8 wherein the PCB cavity is located adjacent to the PIC.

11. The method of claim 8 further comprising:
locating the photonics integrated circuit (PIC) within the carrier; and
locating the driver IC within the carrier, wherein the RDL is further disposed across the first side of the PIC and the first side of driver IC.

12. The method of claim 11 further comprising locating the PIC in the PCB cavity in the first side of the PCB such that a first portion of the first side of the PIC overlaps the cavity and a second portion of the first side of the PIC overlaps the first side of the PCB.

13. The method of claim 12 further comprising disposing the RDL across the second portion of the first side of the PIC that overlaps the PCB.

14. The method of claim 8, further comprising inserting an optical fiber into the PCB cavity such that the optical fiber forms a direct optical connection with the PIC.

* * * * *